United States Patent

Shuck et al.

[11] 3,986,106
[45] Oct. 12, 1976

[54] PORTABLE SET FOR AUTOMATIC SEQUENTIAL TEST OF MULTIPLE WIRE PAIRS

[76] Inventors: Edward E. Shuck, 545 Eureka, San Francisco, Calif. 94114; Neil Hudson, 90 Nido Ave., San Francisco, Calif. 94115

[22] Filed: Mar. 31, 1975

[21] Appl. No.: 563,726

[52] U.S. Cl. .................................. 324/51; 324/66; 179/175.3 R
[51] Int. Cl.[2] ..................................... G01R 31/02
[58] Field of Search ................. 324/51, 66, 73; 179/175.3 R

[56] References Cited
UNITED STATES PATENTS

| | | | |
|---|---|---|---|
| 2,822,519 | 2/1958 | Murphy | 324/66 |
| 2,869,076 | 1/1959 | Evans et al. | 324/51 |
| 3,182,253 | 5/1965 | Dorsch et al. | 324/66 X |
| 3,287,509 | 11/1966 | Bohnenblust | 324/66 X |
| 3,354,389 | 11/1967 | Hordosi | 324/51 X |
| 3,528,104 | 9/1970 | Ehlschlager | 324/51 |
| 3,678,379 | 7/1972 | Arvay et al. | 324/51 X |
| 3,699,438 | 10/1972 | Webb | 324/66 |
| 3,728,616 | 4/1973 | Cheek et al. | 324/51 |

FOREIGN PATENTS OR APPLICATIONS

| | | | |
|---|---|---|---|
| 189,684 | 4/1957 | Austria | 324/66 |
| 1,142,660 | 1/1963 | Germany | 324/66 |

*Primary Examiner*—Gerard R. Strecker
*Attorney, Agent, or Firm*—David B. Harrison

[57] ABSTRACT

A portable cable test set includes a master unit connected to one end of a cable made up of multiple wire pairs and a remote unit connected to the other end. The master unit generates a series of digital pulses, a pulse being applied to a first wire of each wire pair in a predetermined sequence. The remote unit interconnects the wire pair with a resistor of predetermined resistance which differs from every other resistor and which is much greater than the resistance of the wire pair undergoing testing. A corresponding resistor of like value is included in the master unit and receives the same pulse that is applied to the wire undergoing testing. A comparator in the master unit compares the magnitude of the pulse sent over the wire pair with the magnitude of the pulse sent through the reference resistance in the master unit and a sequencer applies the next pulse to the next wire and next corresponding resistance when the preceding pulse magnitudes are equivalent. An interrupter stops the test sequence when the compared pulses are unequal in magnitude, and an indicator then identifies the wire pair having conditions activating the sequence interrupter.

10 Claims, 6 Drawing Figures

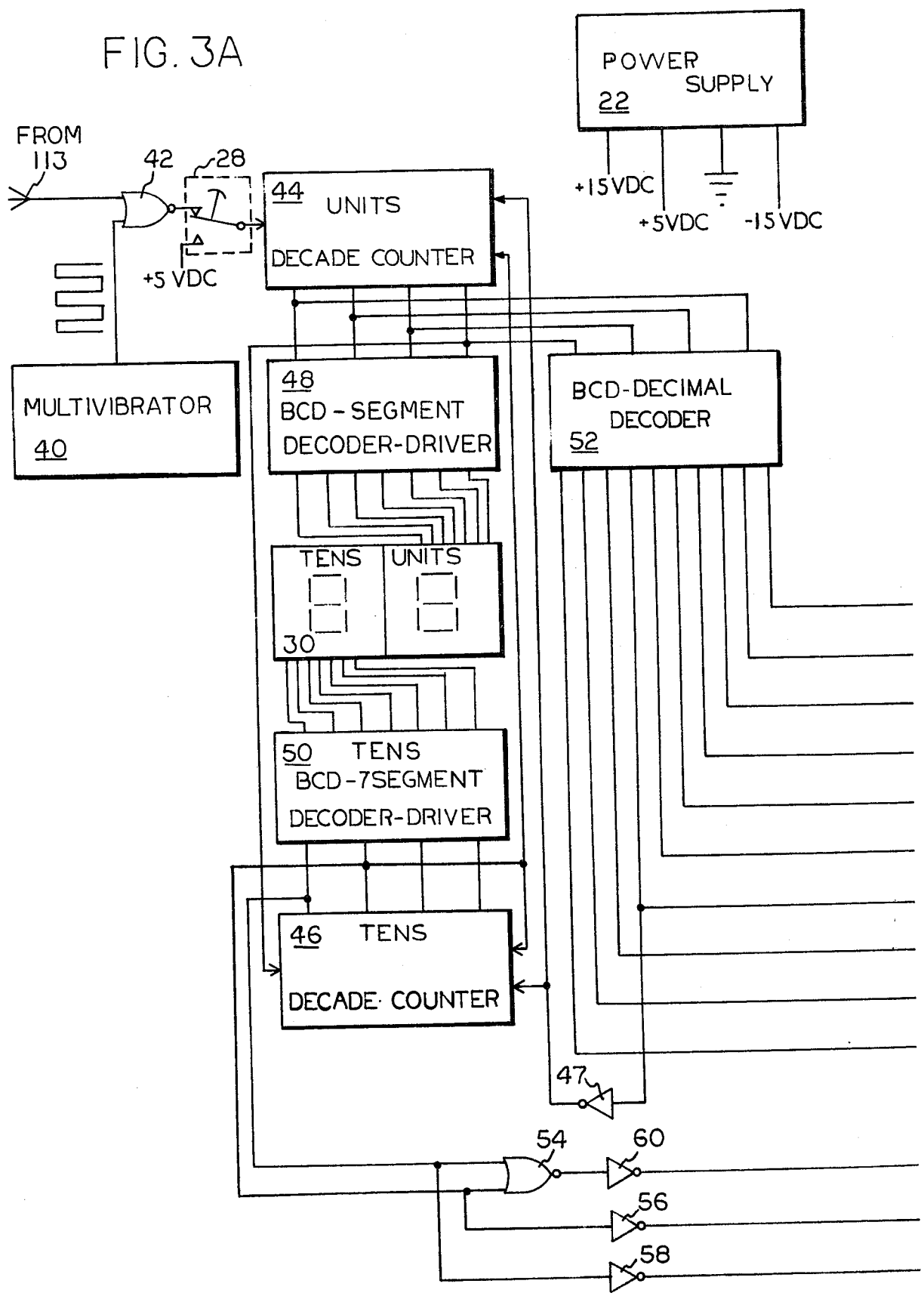

PORTABLE SET FOR AUTOMATIC SEQUENTIAL TEST OF MULTIPLE WIRE PAIRS

BACKGROUND OF THE INVENTION

The present invention relates to portable multiple pair cable test apparatus and more particularly to a portable self-contained automatically sequencing test set for confirming the continuity and detecting shorts, crosses and reverses between any of the pairs of a multiple pair cable.

Complex telephone and communications systems have proliferated and with the introduction of such systems, such as multiple line telephone sets, communications cables of many wire pairs have been required in order to connect each telephone set with centrally located power supplies, signal indicator units, intercom modules and other sets. Telephone set cables typically include at least 25 wire pairs, and often many more pairs within the cable. A typical installation of communications cable includes interconnections through many terminal blocks and connectors before establishing paths between each telephone set, the telephone equipment room, and the central office equipment. In such installations there are many opportunities for dis-continuities to occur within the cable. For instance, the cable section may contain factory defects, or the installer may have made errors in connection causing the pairs to be terminated at the wrong terminals and connectors, or to be shorted or to be crossed or to be opened.

A standard practice followed in the telephone industry has been to provide telephone connection cables with preinstalled connection plugs at one end thereof. The plugs have been installed and tested in the factory and are generally reliable. The disadvantage of this practice has been that the cables have been of predetermined length necessarily always in excess of the length of cable required for any given installation. Thus, the cable has been cut at the other end, resulting in wasted cable. A recent development to overcome this waste has been to provide installers with tools for installing connectors in the field. Where this practice is employed, cable may be cut to precise length, and connectors are then applied with the aid of tools such as the Field Assembly Solderless Termination (FAST) tool made by the Amphenol Industrial Division of Bunker Ramo, Inc. Because of human errors and adverse working conditions the quality control and circuit reliability of such field-installed connectors may not be as high as the quality of the factory installed connectors.

A need has therefore arisen for rapidly checking the integrity of communication cables in the field, particularly inside office buildings, point to point cables, house cables, riser cables, cables between the telephone room and the telephone set location, cables between various PBX, PABX etc. components, cables between various parts of computer installations, cables between the various frames, racks or bays of telephone equipment, installed or uninstalled, cables between permanent or temporary racks, inside or outside the telephone central office installation, etc.

The standard testing procedure followed in the past, having drawbacks overcome by the present invention, involves manually placing a test signal on each pair of the cable at one end in sequence and identifing the pair at the other by manually searching for the pair with the signal on it. Such a slow procedure often requires many hours, days or even weeks for testing cables having multiple pairs in large installations. In addition, the possibilities of human error in such a testing routine are significant and, at least two technicians are required to perform such tests. In addition, miswires and crossed wires and shorts to other wire pairs have often gone undetected. All of these foregoing limitations are overcome by the present invention.

It is therefore an object of the present invention to provide a multiple pair cable test set that automatically tests each wire pair in the cable for continuity and correct connection, and that stops the test sequence automatically upon the detection of a dis-continuity, short, or other incorrect interconnection of a wire pair undergoing testing.

Another object of the present invention is to provide a cable test set with a display that gives a visual identification of a wire pair having a dis-continuity or misconnection.

A further object of the invention is to provide a multiple pair cable test set which is fully self contained and portable, that does not require special cabling or interconnection and that may be rapidly connected to installed cables, and that may be operated by a single operator to provide an accurate and comprehensive test of cable pairs.

SUMMARY OF THE INVENTION

The aforesaid objects are accomplished by a self-contained, portable test set which includes a master unit connected to one end of a multiple wire cable and the remote unit connected to the other end of the cable. A pulse generator within digital circuitry in the master unit generates a sequence of pulses of equal magnitude. The circuitry gates a pulse to a preselected tip or ring wire of a predetermined cable pair. The pulse passes through the wire to the remote unit at the other end where it then passes through a resistor of preselected value which is connected to the other tip or ring wire of the wire pair. At the same time the pulse is applied to a resistor of the same value at the master unit. The resistance of both resistors is a predetermined value much higher than the resistance of the wire, and the resistance is different for each wire pair. A pulse comparator in the master unit compares the magnitude of the pulse returned from the remote unit with the pulse passing through the reference resistance in the master unit. If the comparator determines the pulse magnitudes are equal, the master unit then automatically sequences to the next cable pair and repeats the foregoing test. It is to be remembered that for the second cable pair a different resistance will be used at the remote unit and at the reference resistance in the master unit. Thereby, each cable pair is assigned a different resistance so that any misconnection or cross connection of wires will be detected by difference in compared pulse magnitudes. Diodes are used to establish one way pulse paths to provide a check against reversed wires in a pair. In the event of detection of unequal pulse magnitudes, a sequence interrupter in the master unit stops the test sequence, and a visual indicator identifies the wire pair having conditions activating the sequence interrupter. Thus, the test unit will automatically sequence from wire pair to wire pair until such time as a difference incompared pulse magnitudes cause the sequence to be interrupted. Then the visual indicator in the master unit identifies the wire pair not passing the tests.

BRIEF DESCRIPTION OF THE DRAWINGS

FIG. 3a, 3b, 3c are the block diagram of the apparatus of the present invention, except for the digital comparator element.

DESCRIPTION OF THE PREFERRED EMBODIMENT

Figure 1:
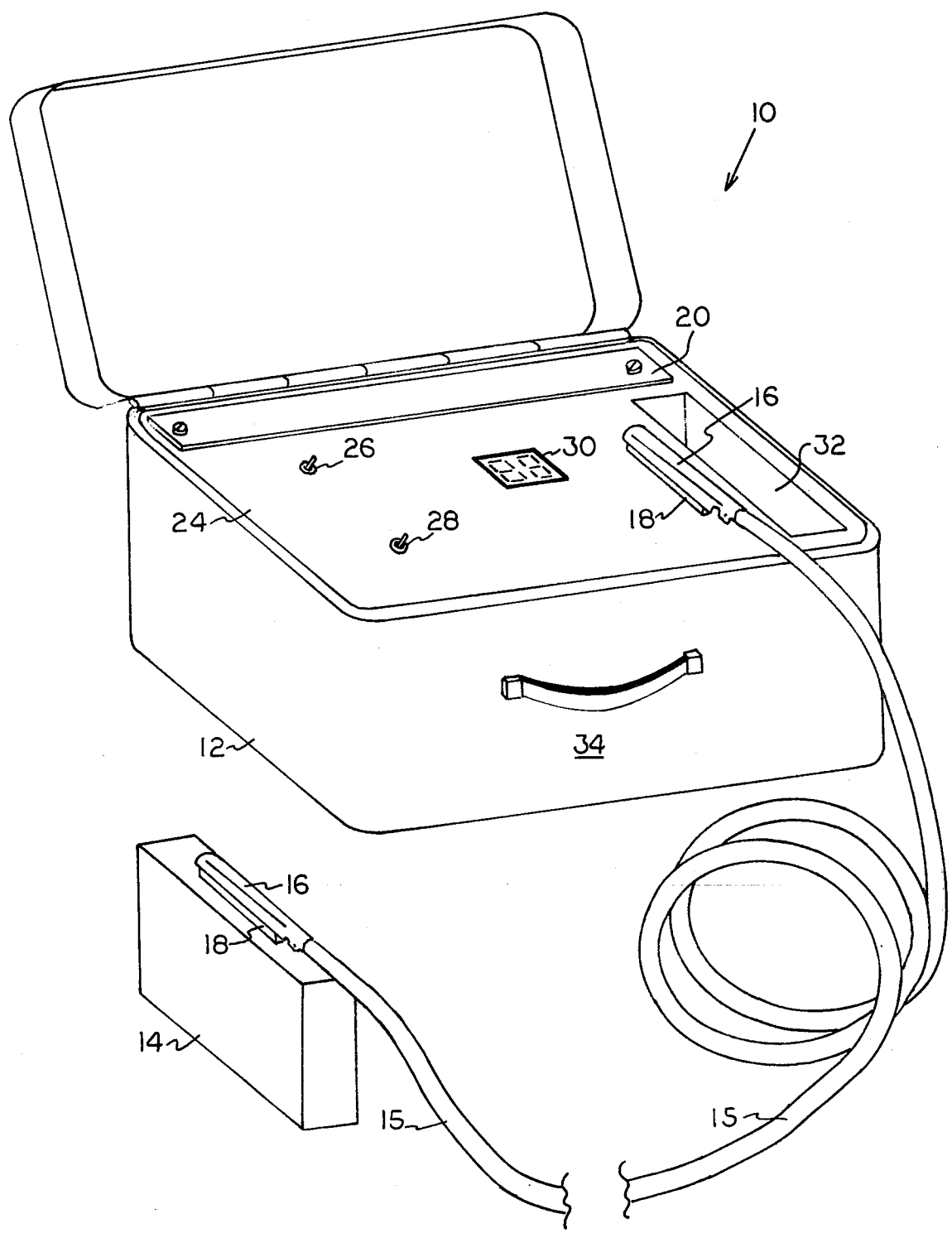
FIG. 1 is a view in perspective of the cable test set of the present invention. A length of cable undergoing testing is connected between the master unit and the remote unit; it is broken to save space.

With reference to the drawings, FIG. 1 illustrates the portable multiple pair cable set 10 of the present invention. A master unit 12 is shown connected to a remote unit 14 through a cable 15 undergoing testing. The cable 15 terminated in plugs 16 which mate with receptacles 18 in the master unit 12 and the remote unit 14. The master unit 10 contains a battery compartment 20 where the batteries providing a power supply 22 for the test set may be connected. All control panel 24 of the master unit provides all necessary controls including a power on and off switch 26, an inhibit release switch 28 and a digital display 30 for identifing sequentially each wire pair of cable 15 undergoing testing from moment to moment during the test sequence. A storage well 32 may also be provided for the remote unit 14 in the control panel 24 of the master unit 12. As shown in FIG. 1 the test set 10 may be very portable, with the master unit 12 contained in a suitcase type container 34 having a suitable handle, a hinged cover, and a suitable cover latch device. As will be explained in more detail hereinafter, the remote unit 14 is made of passive resistor and diode networks and therefore may be housed in any suitable small box or container.

Figure 2:
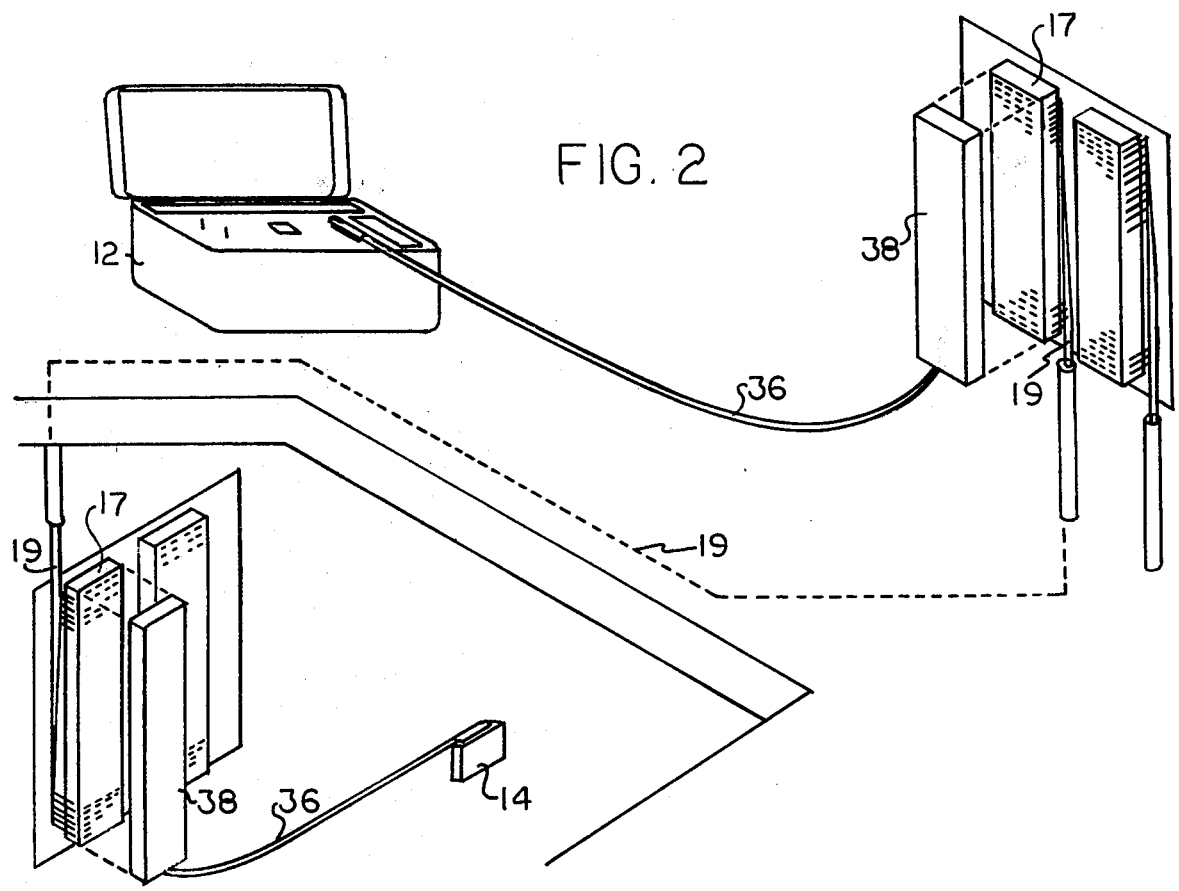
FIG. 2 is another perspective view of the test set, shown connected to terminal blocks.

In FIG. 2 the cable set 10 is connected to another cable 19 which is terminated at connection blocks 17. Connector block adaptor cables 36 provide an interconnection between the master unit 12 and remote unit 14 and the connector blocks 17. Each cable 36 has a connection block adaptor 38, one end of which fits over a test block 17 to provide the required electrical connection.

Turning now to FIGS. 3a, 3b, 3c and 4, the circuitry of the cable test set 10 for a twenty-five wire pair cable includes the power supply 22 which provides nominal DC voltages of +15, +5, and −15 volts. A free running multivibrator 40 generates square wave pulses of equal magnitude, each cycle having a period of approximately one half second. The pulses from the multivibrator are applied to one input of a NOR sequence gate 42. Under normal test conditions the other input to the sequence gate 42 is low or logic 0, inverted pulses from the multivibrator 40 are output from the logic gate 42 through the manual inhibit release switch 28 to the input of a units decade counter 44. The most significant digit output of the units decade counter 44 is connected to an input of a tens decade counter 46. The counters 44 and 46 are wired to count from 0 to 25, to provide a count corresponding to the number of wire pairs to be tested.

One of the outputs of the decade counter 46 is connected to the first reset inputs of both the units counter 44 and the tens counter 46. Output six of a decimal decoder 52 is inverted by an inverter 47 and then applied to the second reset inputs of the counters 44 and 46. When both inputs of the counters receive simultaneous one level pulses, both counters are reset to zero.

Information in a binary format from the units counter 44 is fed continuously through a binary coded decimal to seven segment decoder driver 48 and information from the tens counter 46 is fed to a similar decoder driver 50. The decoded outputs of the drivers 48 and 50 respectively provide the units and tens display 30.

Output information from the units decade counter 44 is also supplied to the input of the binary coded decimal to decimal decoder 52. Output information from the tens decade counter 46 is also supplied to the inputs of a NOR gate 54 and inverters 56 and 58. The output of the NOR gate 54 is inverted by an inverter 60. The outputs of the decimal decoder 52 and the inverters 56, 58, and 60 provide sequential gating pulses to 25 NOR test gates 62a through 62y, inclusive. In the present embodiment, a zero logic signal is utilized to open in sequence each of the test gates 62a through 62y, whereas a one logic level at the input inhibits the gates except when such is opened by a zero pulse. Thus, a zero pulse from the decoder 52 in combination with a zero output level from one of the inverters 56, 58, or 60, selectively enables in sequence one of the test gates 62a through 62y. The enabled gate outputs a logic one test pulse to its respective line, the line pairs being arbitrarily numbered 1 through 25.

Figure 3B:
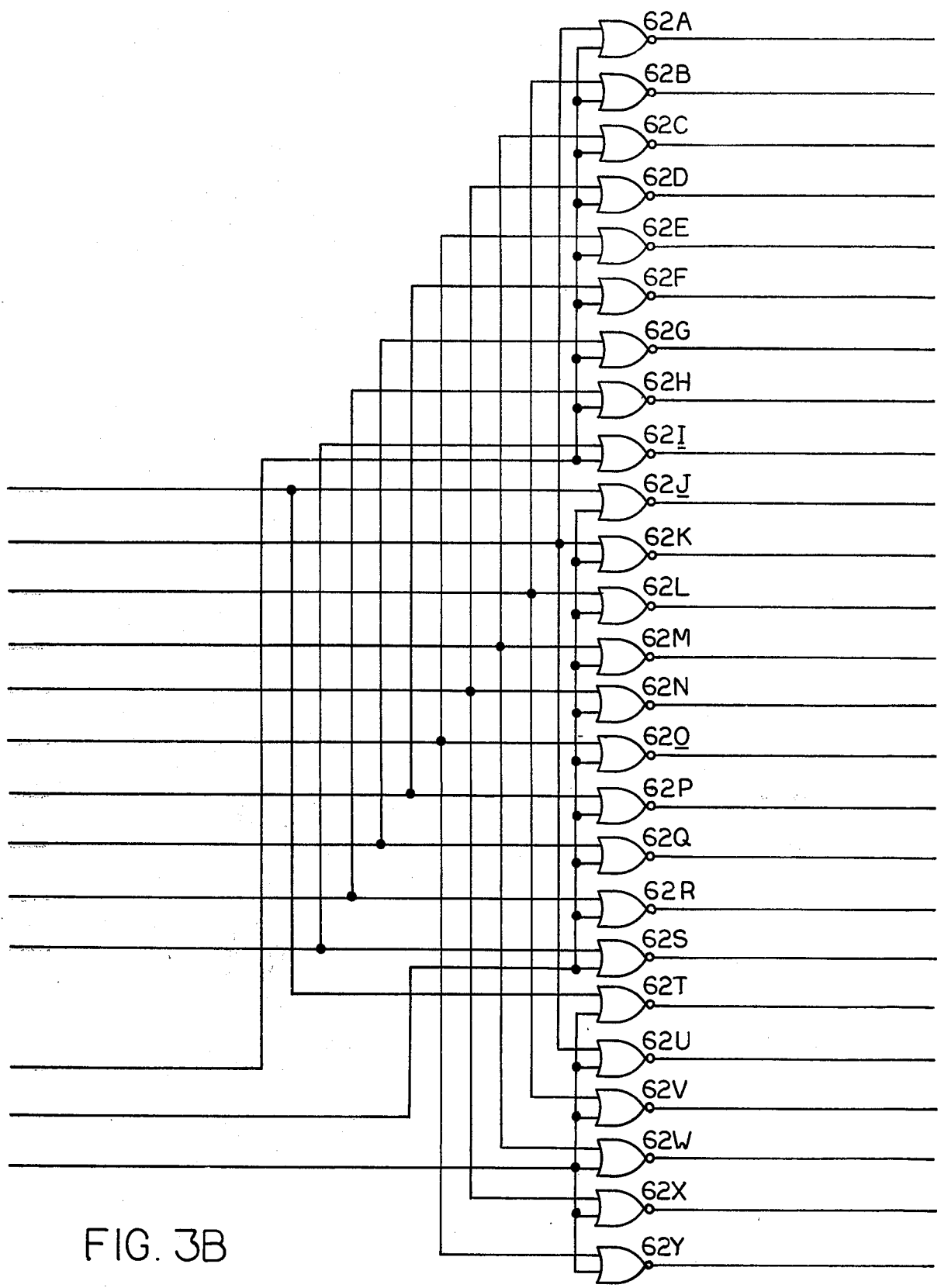
Figure 3C:
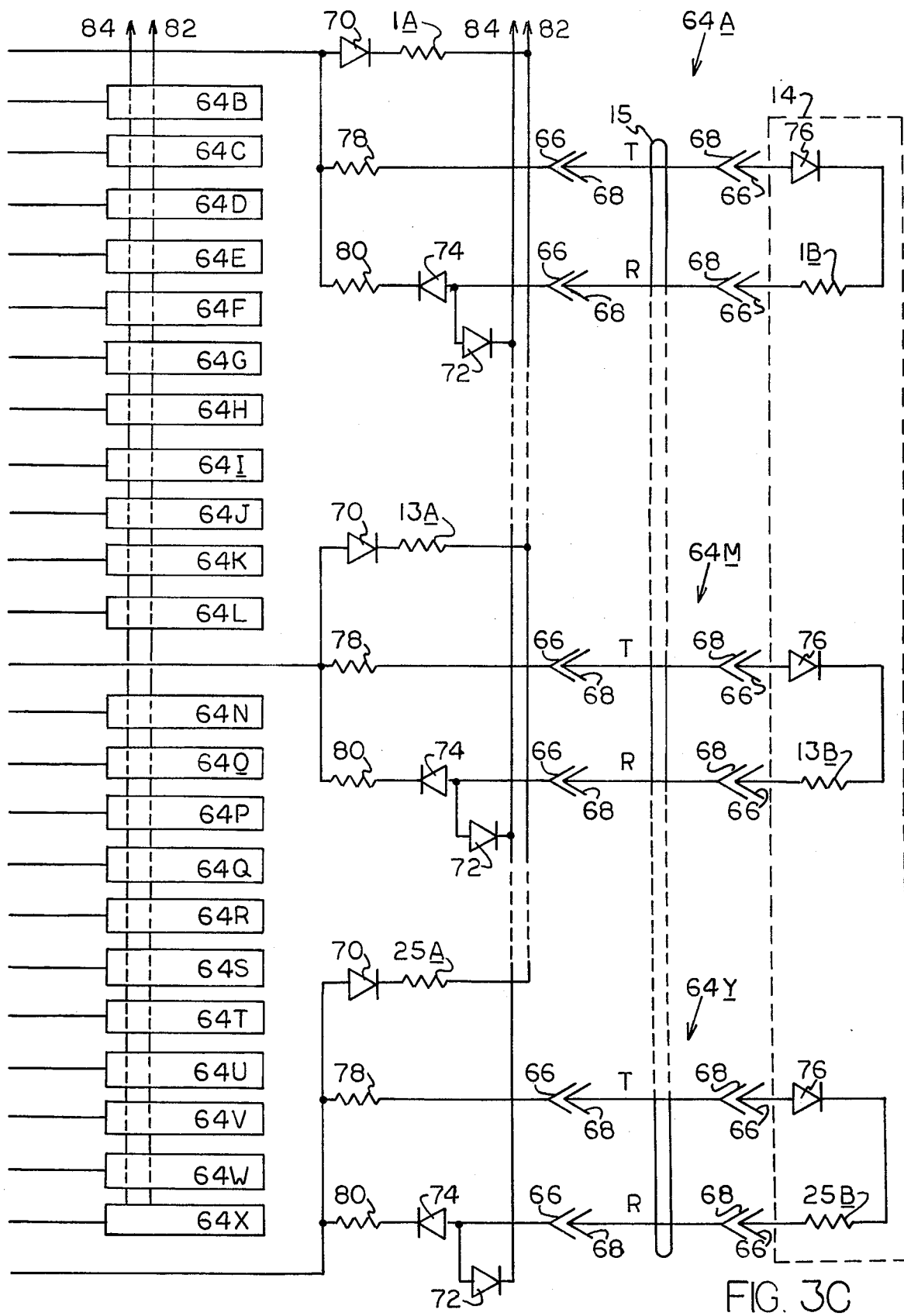

The line test pulse output from each line test gate is applied to a line test network. There are twentyfive such line test networks, 64a through 64y, each of which is connected to its corresponding line test gate 62a through 62y respectively. In FIG. 3c, three line test networks 64a, 64m and 64y are shown schematically, whereas the remaining line test networks 64b through 64l, and 64n through 64x are shown in block diagram format. The line test networks 64a through 64y are substantially identical, the exception being that each network includes two resistors of a predetermined value of resistance of a value different from the value assigned to corresponding resistors in every other network.

From the drawings it is to be understood that each network 64a through 64y includes components in the master unit 12 and in the remote unit 14, which are interconnected by the tip (t) and ring (r) wires of each wire pair (lines 1 through 25). Thus, connector contacts 66 of the sockets 18, the corresponding contacts 68 of the plugs 16 and the cable 15 undergoing testing form a part of each network 64a through 64y. Each network additionally includes a reference diode 70, a pulse return diode 72 and a short detection diode 74 in the master unit, and a cross inhibit diode 76 in the remote unit. There are two overload protection resistors 78 and 80, the interconnection of these components is as shown in FIG. 3c. There are two pulse busses paralleled through all networks 64a through 64y, a reference pulse buss 82 and a test pulse buss 84. These busses supply input pulses to the comparator element shown in FIG. 4.

As mentioned hereinabove, each network includes a pair of resistors of assigned equal value differing from every other like pair. The value selected is much higher than the resistance of the wire pair undergoing testing. Values in the range of 5K ohm to 5K ohm are preferred. Thus, for each network, the resistors of the pair are given numbers corresponding to the line and subscripts $a$ and $b$, the $a$ meaning the reference resistor and the $b$ meaning the line test resistor.

The signal path through the first network 64a, which is the signal path through all error free networks, will now be described. A one logic pulse is output from the line test gate 62a and passed to the input of the line test network 64a where the pulse passes through the reference diode 70 and the reference resistor 1a and thence onto the reference pulse buss 82. At the same time the pulse is passed through a series resistor 78 to the tip wire of line 1 through a contact 66 to contact 68 in the socket 18 and plug 16 at the master unit 12.

The pulse passes through a second contact 68 to contact 66 in the plug 16 and socket 18 at the remote unit 14. In the remote unit the pulse is passed through the cross inhibit diode 76 and the line test resistor 1b of the equal resistance pair. The pulse then returns to the master unit via the ring wire of line 1 and passes through the pulse return diode 72 and onto the line test buss 84.

Figure 4:
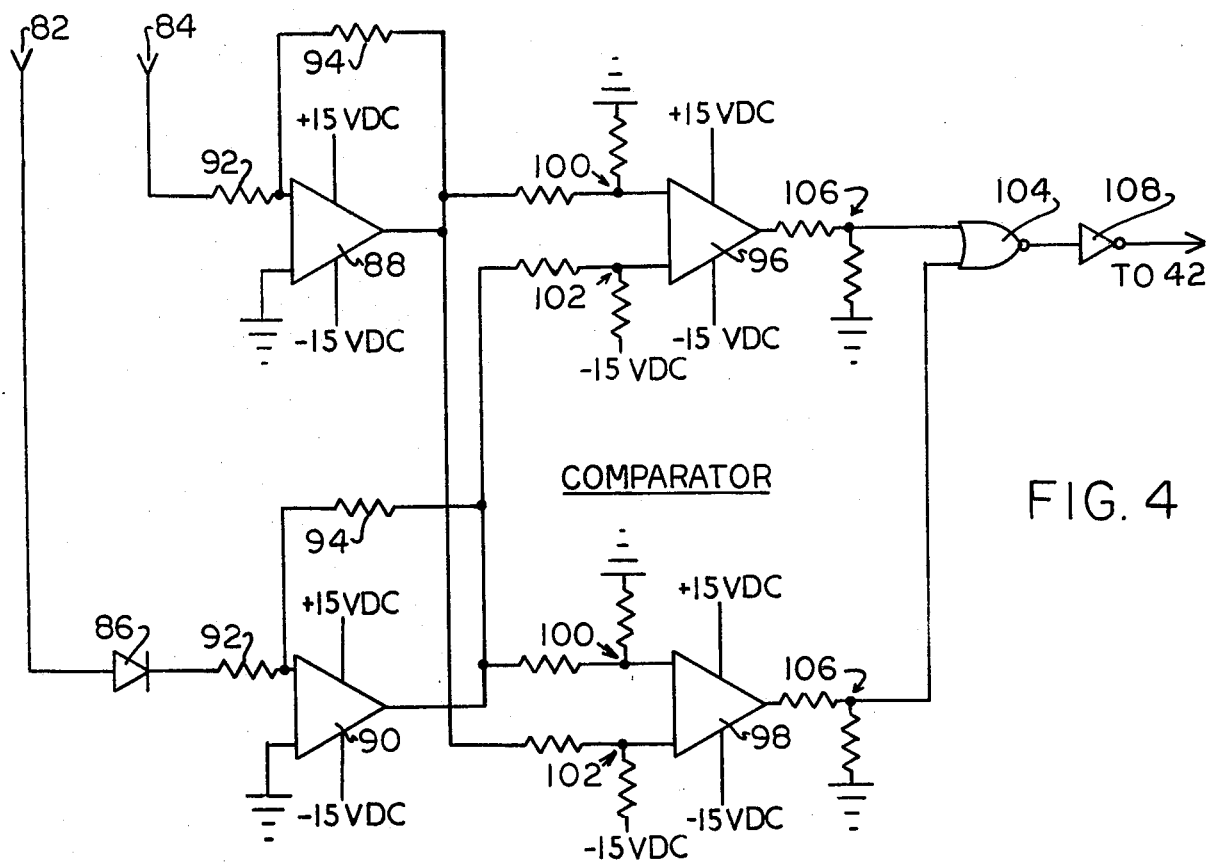
FIG. 4 is a schematic diagram of the digital comparator element.

Referring now to FIG. 4, the test pulse exits the line test buss 84 and provides one input to an operational amplifier 88. The reference buss 82 provides a similar input to a second operational amplifier 90 through a balance diode 86. Input protection resistors 92 limit the input voltage of the pulses while feedback resistors 94 are employed to limit gain excursions of the operational amplifiers 88 and 90. The other input of the operational amplifiers may be grounded. The operational amplifiers 88 and 90 convert the digital logic pulses to voltage levels. The output of the operational amplifiers 88 and 90 provide one of the two inputs of a pair of identical voltage comparators 96 and 98. Voltage divider networks 100 and 102 are used to maintain correct logic levels at the inputs of the voltage comparators 96 and 98. The outputs of the voltage comparators 96 and 98 provide the inputs to a NOR gate 104 through voltage divider networks 106, used to maintain correct logic levels. The output of the NOR gate 104 is inverted by an inverter 108, the output of which provides the inhibit input to the NOR gate 42.

In the case of a test good condition, the magnitude of the pulse on the line test buss 84 will equal the magnitude of the pulse on the reference buss 82. In this event the output of the voltage comparators 96 and 98 will be low and the output of the NOR gate 104 will be high, producing a low output at the inverter 108. This output signal will not inhibit the gate 42, and it passes the next multivibrator pulse through the counter 44 and decoder 52 to enable line test gate 62b and the foregoing test sequence is then applied to line 2.

When unacceptable conditions exist in a wire pair being tested, such as an open, short, reverse, or cross, the magnitude of the reference pulse on the reference buss 82 will not be equal to the magnitude of the pulse, if any, on the line test buss 84. In this case the operational amplifiers 88 and 90 will present unequal output voltages to the inputs of the voltage comparators 96 and 98 which will drive the output of one of the comparators positive or to a logic one state. The NOR gate 104 will switch to a logic zero condition and the inverter 108 will then output a logic one level which will clamp the output of the sequence gate 42 to a zero level. The zero level at the output of the sequence gate 42 inhibits all further pulses received from the multivibrator 40 as they are effectively grounded by the zero state. The decade counter 44 cannot then advance, and testing will not continue. The display of the display unit 30 is latched at the digits indicated, which will be the digits of the line presenting the unacceptable condition. The test set will not sequence until the inhibit switch 28 is activated to release the inhibit signal from the decade counter 44. To confirm the unacceptable condition, or to resume the test sequence, the inhibit switch 28 (which is a momentary action, single pole double throw switch) may be momentarily depressed. Sequential testing thereupon resumes.

Several typical unacceptable line conditions will now be described. For example, the tip and ring wires of line 1 may be reversed at the remote unit end of the cable. In this case the cross inhibit diode 76 would block the pulse at the remote unit and no pulse would be passed to the line test buss 84, and one of the voltage comparators would generate an inhibit pulse. This pulse would inhibit the sequence gate 42 and sequencing would cease with the display unit indicating the reversed line. In another example, if the tip and ring wires of line 1 are shorted, the line test resistor 1b will be bypassed, and a pulse of much greater magnitude than the reference pulse will be sensed on the line test buss 84. The comparators will then inhibit the sequence gate 42 and sequencing again ceases. In a further example, the tip wire of line 1 is assumed to be crossed with the ring wire of line 13. In this case the test pulse will be shunted to ground through the short detection diode 74 in network 64m (it being remembered that the inputs of all networks except the one being tested are held at a zero logic or ground potential by the gates 62). This no-pulse or reduced pulse situation will likewise inhibit the test sequence gate 42. In like manner, if, e.g., the tip wire of line 1 is shorted to the tip wire of line 13, the test pulse will be shunted directly to ground through the overload protection resistor 78 of network 64m.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. Self-contained portable apparatus for automatic sequential test and verification of the wire pairs within a cable, including:

digital circuit means connected at a first location to a first wire of each said wire pair to be tested, said digital means for generating a series of pulses equal at least to the number of said pairs to be treated and for applying in automatic sequence a pulse to each first wire of each said wire pair;

network means at a second location of said cable for interconnecting each first wire to a corresponding second wire of each said wire pair so that a said pulse sent on a predetermined first wire of a pair is returned to said first location on the corresponding second wire of said pair;

reference signal converter means at said first location connected to said digital circuit means for receiving said pulses and converting each pulse into a reference signal uniquely corresponding to each said wire pair;

test signal converter means within said network means and forming a part thereof for converting each pulse received at said second location into a test signal uniquely corresponding to each said wire pair;

analog comparator circuit means at said first location and connected to said reference signal converter means and to each second wire of said pairs or comparing each said unique reference signal with each corresponding unique test signal to determine equivalence or non-equivalence thereof;

sequence inhibit circuit means at said first location connected to said comparator circuit means and to said digital circuit means for automatically stopping said digital circuit means from sequencing in the event that said comparator circuit means determines non-equivalence;

pair identification indicator means within said digital circuit for indicating in sequence each said pair undergoing a test;

whereby a test signal determined to be equivalent to a corresponding reference signal verifies the existence of a said properly connected, non-shorted and conducting wire pair whereupon said digital circuit means automatically sequences to test a said next wire pair and continues to test all said wire pairs unless during a test sequence a test signal is determined to be non-equivalent to a corresponding reference signal whereupon said digital circuit means stops sequencing and said pair identification indicator means identifies the wire pair found thereby to contain an error.

2. The cable test apparatus of claim 1 wherein said pair identification indicator means includes digital display means for visually identifying in sequence each said predetermined pair undergoing testing, whereby upon detection of an error in the said pair said display means provides a visual identification of said pair having an error.

3. The cable test apparatus of claim 1 wherein said network means comprises a series of precise line test resistors of preselected value, one of said resistors providing the interconnection of a preselected first wire and a second wire of a said preselected pair, each said resistor having an assigned value of resistance differing from every other resistor of said series and much greater than the resistance of each said wire pair having no error therein;

and wherein said reference signal converter means includes a series of reference resistors each of which corresponds to a said line resistor, and said digital circuit means includes gating circuitry for applying each said test pulse to a said reference resistor as it is applied by said digital circuit means to a said preselected first wire terminating at the said line test resistor corresponding to the said reference resistor.

4. The cable test apparatus of claim 3 wherein said passive network means additionally comprises a blocking diode connected in series with each said precision line test resistor, whereby a reverse connection of the preselected first wire and the second wire of a predetermined pair undergoing pulse testing may be detected.

5. The cable test apparatus of claim 1 wherein said digital circuit means includes a free running multivibrator connected through a test inhibit gate and thence through a line selection decoder matrix and gating system to the first wires of said cable.

6. The cable test apparatus of claim 1 including in electrical interconnection crossed wire detection means for testing every other wire pair in said cable while each said pair undergoes testing to produce a non-equivalence between said reference signal and said test signal if a wire of said pair undergoing testing is connected to any wire of said cable other than the other wire of said pair undergoing test.

7. A self-contained portable cable test set connected at each end to the wires of a communication cable of multiple wire pairs including in combination:

a master unit connected to said pairs at a local end of said cable and a remote unit connected to said same pairs at a remote end of said cable;

pulse generator means in said master unit for generating a sequence of pulses of substantially equal magnitude, there being a separate pulse generated for each wire pair of the cable to be tested therewith;

digital logic means connected to said pulse generator means in said master unit for sequentially gating each pulse to a preselected one of the tip or ring wires of each said pair to produce a test pulse and simultaneously to one of a series of reference resistors to produce a reference pulse;

network means in said remote unit including a line test resistor of preselected value equal to a said reference resistor with which it corresponds, said line test resistor interconnecting the tip and ring wires of each said pair, each line test resistor having a value differing from every other line test resistor and which value is substantially greater than the resistance of the said pair interconnected thereby;

pulse magnitude analog comparator means connected to said reference resistors, the other of the tip or ring wires of each said pair and to said digital logic means, said comparator means for testing each said pair by comparing the amplitude of a reference pulse with a test pulse from a said pair undergoing test and verifying correct, nonshorting connections of said pair when said pulses are of substantially equal magnitude and inhibiting sequencing of said digital logic means if said compared pulses are not of substantially equal magnitude.

8. The cable test set of claim 7 additionally comprising digital display means connected to said digital logic means in said master unit for visually identifying in sequence each said wire pair undergoing testing, whereby upon inhibition of sequencing said display means identifies a said pair causing such sequence inhibition.

9. The cable test set of claim 7 wherein said passive network means in said remote unit includes a blocking diode for each said wire pair, each said diode being connected in series with each said line test resistor whereby a reversed connection of a said ring wire may be detected by said test set.

10. The cable test set of claim 7 additionally comprising a second wire detection diode for each said wire pair, each said diode being connected between said digital logic means and said wire pair and wherein said digital logic means maintains all of said wire pairs at a common logic level except for said wire pair undergoing test whereby a cross-connection between a said pair undergoing testing and any other wire in said cable results in said pulse passing through said pair under test whereby a cross-connection between a said pair undergoing testing and any other wire in said cable results in said pulse passing through said pair under test being shunted through a said crossed wire detection diode to said common logic level thereby changing the magnitude of said pulse which thereupon causes said comparator means to inhibit sequencing.

* * * * *

UNITED STATES PATENT AND TRADEMARK OFFICE
CERTIFICATE OF CORRECTION

PATENT NO. : 3,986,106
DATED : October 12, 1976
INVENTOR(S) : Edward E. Shuck and Neil Hudson It is certified that error appears in the above-identified patent and that said Letters Patent are hereby corrected as shown below:

Column 3, line 30, replace "All" with --A--;

Column 5, line 3, replace "5K ohm to 5K ohm" with --5K ohm to 50K ohm--;

Column 6, line 56, replace "treated" with --tested--;

Column 7, line 8, "pairs or" should read --pairs for--;

Column 7, line 48, after "said line" insert --test--.

Signed and Sealed this

Eleventh Day of October 1977

[SEAL]

Attest:

RUTH C. MASON
Attesting Officer

LUTRELLE F. PARKER
Acting Commissioner of Patents and Trademarks